United States Patent [19]

Murotani

[11] Patent Number: 4,771,322
[45] Date of Patent: Sep. 13, 1988

[54] SEMICONDUCTOR MEMORY DEVICE WITH LOW-NOISE STRUCTURE

[75] Inventor: Tatsunori Murotani, Tokyo, Japan

[73] Assignee: NEC Corporation, Tokyo, Japan

[21] Appl. No.: 928,584

[22] Filed: Nov. 10, 1986

Related U.S. Application Data

[63] Continuation of Ser. No. 720,230, Apr. 5, 1985, abandoned.

[30] Foreign Application Priority Data

Apr. 5, 1984 [JP] Japan .................................. 59-67998

[51] Int. Cl.$^4$ ..................... H01L 29/78; H01L 27/02; H01L 29/04; H01L 29/34
[52] U.S. Cl. .................................... 357/23.6; 357/41; 357/54; 357/59
[58] Field of Search ..................... 357/23.6, 41, 59 G, 357/59 I, 59 J, 54

[56] References Cited

U.S. PATENT DOCUMENTS

| | | | |
|---|---|---|---|
| 4,128,670 | 12/1978 | Gaensslen | 357/59 I |
| 4,329,706 | 5/1982 | Crowder et al. | 357/59 I |
| 4,488,166 | 12/1984 | Lehrer | 357/59 I |

*Primary Examiner*—Gene M. Munson
*Attorney, Agent, or Firm*—Sughrue, Mion, Zinn, Macpeak & Seas

[57] ABSTRACT

A semiconductor memory device which has low noise structure and is operable with high stability.

The memory device employs a plurality of single transistor memory cells each composed of a capacitor and a transistor coupled between one electrode of the capacitor and a bit line, the other electrode of the capacitor being supplied with a predetermined potential. The other electrode is made of a refractory metal, and a relatively low sheet resistance is provided to the other electrode of the capacitor so that the potential fluctuation at the other electrode of the capacitor is suppressed.

11 Claims, 4 Drawing Sheets

SEMICONDUCTOR MEMORY DEVICE WITH LOW-NOISE STRUCTURE

This is a continuation of Ser. No. 720,230, filed Apr. 5, 1985, now abandoned.

BACKGROUND OF THE INVENTION

The present invention relates to a semiconductor memory device, and particularly to a dynamic type semiconductor memory device employing field effect transistors.

Memory capacity of dynamic type semiconductor memories has been increasing remarkably and 256K-bit dynamic memories have become commercially available. Accompanied by such increase in memory capacity, problem of array noise has been becoming serious. As, is well known in the art, dynamic type semiconductor memories employ so-called one-transistor memory cells, each of which is composed of a capacitor and a transfer gate transistor coupled betwen the capacitor and a bit line. Reading-out of information stored in a memory cell is performed by sensing a small amplitude potential which is produced by capacitive-division of a capacitance of the cell capacitor and the bit line capacitance.

The array-noise is usually caused by capacitive coupling among bit lines in memory cell array, and operations of sense amplifiers affect from each other through the capacitive coupling. For example, most of sense amplifiers amplify one of binary logic levels and the remaining small number of sense amplifiers amplify the other of the binary logic levels and the remaining small number of sense amplifiers amplify the other of the binary logic levels, the remaining small number of sense amplifiers are inevitably affected towards one of the binary logic levels by the most of sense amplifiers.

According to the recent tendency of large memory capacity, the bit line capacitance is increased because of increase in number of memory cells coupled to each bit line while the capacitance of each memory cell capacitors has inevitably become small. Accordingly, the small amplitude signal read-out on the bit line from the addressed memory cell has been further becoming small, and on the other hand amount of the array-noise has increased by the increase in memory capacity. As a result, the substantial signal generated on the bit line from the addressed memory cell has become small in view of the array-noise, resulting in difficult detection of stored information.

SUMMARY OF THE INVENTION

It is an object of the present invention to provide a semiconductor memory device which has improved noise-resistant characteristics.

The semiconductor memory device according to the present invention is of the type having a plurality of memory cells, each of the memory cells being composed of a capacitor with electrode commonly supplied with a fixed potential and a transfer gate transistor for operatively connecting the other electrode of the capacitor to one of the bit line, and is featured in that the resistance of the first electrodes of the capacitors and/or the resistance of a wiring for commonly supplying the fixed potential to the first electrode of the capacitors is reduced.

The present invention is based on the novel fact that a major cause of the array-noise is potential fluctuations in the first electrodes of the capacitors due to resistive components of the first electrodes of the capacitors. Therefore, the reduction of the resistive components associated with the above first electrodes of the capacitors effectively reduces the potential fluctuations in the first electrodes of the capacitors so that the array-noise can be suppressed effectively.

Accordingly to one aspect of the invention, the first electrodes of the memory cell capacitors are made of a conductive layer including refractory metal such as Mo, W, Ta, Nb and Ti or silicide of such refractory metal.

According to another aspect of the invention, the first electrodes of the memory cell capacitors are commonly made of a consecutive conductive layer such as a polycrystalline silicon, and at least one highly-conductive wiring is formed on the consecutive conductive layer and contacted with a plurality of different portions of the consecutive conductive layer.

DETAILED DESCRIPTION OF THE INVENTION

Figure 1:
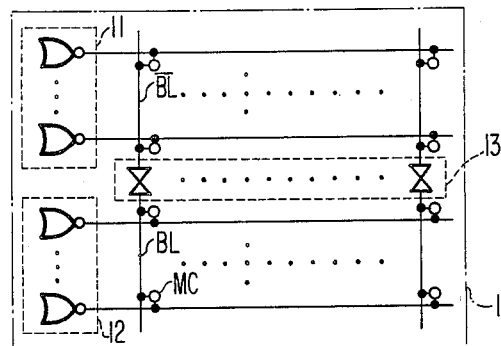
FIG. 1 is a block diagram of a dynamic memory device.

FIG. 1 shows a typical layout example of a 256K bit dynamic type semiconductor memory. The memory is basically composed of two 128K bit arrays 1 and 2.

In the array 1, 256 word lines WL are intersecting with 512 pairs of bit lines BL, $\overline{BL}$. There are 512 sense amplifiers SA which are arrayed in a sense amplifier block 13. Each of the sense amplifiers is connected to each pair of bit lines BL, $\overline{BL}$ and the word lines WL are adapted to be driven by decoders 11 and 12 in a known way. Memory cells MC are arrayed at the intersections of the word lines WL and the bit lines BL, $\overline{BL}$. The array 2 is also structured in the same manner.

Figure 2:
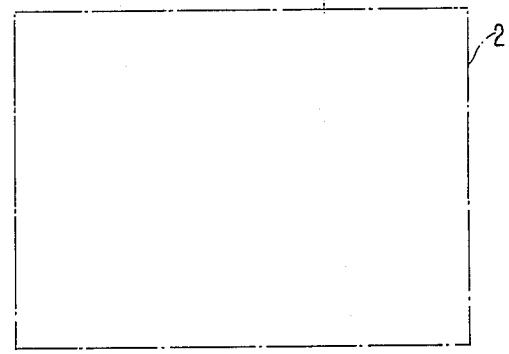
FIG. 2 is a circuit diagram of a part of a memory cell array.
Figure 2:
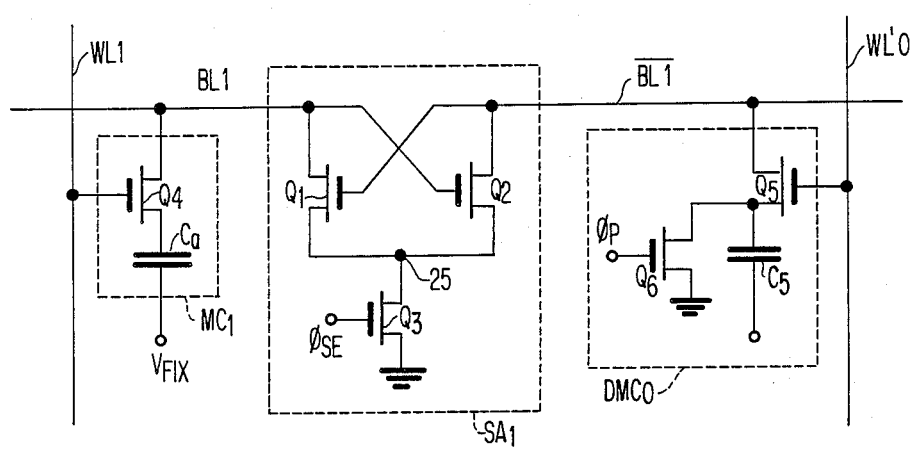

FIG. 2 shows one column of memory cell arrangement in the array 1 or 2. A sense amplifier SA 1 is composed of a pair of flip-flop transistors $Q_1$ and $Q_2$, and a transistor $Q_3$ connected between the sources of the transistors $Q_1$ and $Q_2$ and a ground potential. A memory cell $MC_1$ is composed of a memory cell transistor $Q_4$ and a cell capacitor $C_4$ connected between the transistor $Q_4$ and a constant voltage VFix. A dummy cell DMCo is composed of a transistor $Q_5$, a capacitor $C_5$ connected between $Q_5$ and VFix, and a reset transistor $Q_6$ for short circuiting the capacitor $C_5$. The capacitance of the capacitor $C_5$ is selected at a half of the capacitance of the cell capacitor $C_4$. Prior to a read operation, the bit lines BL1 and $\overline{BL1}$ are precharged to a predetermined potential and the transistor $Q_6$ is conducting to reset the dummy cell $DMC_o$.

When the word line WL1 is selected, the transistor $Q_4$ becomes conducting to connect the cell capacitor to the bit line $\overline{BL1}$ while the dummy word line WL' is raised in potential to connect the capacitor $C_5$ of the dummy cell $DMC_o$ to the bit line BL1. Thus, a small potential difference is provided between the bit lines BL1 and $\overline{BL1}$. Then, the sense amplifier $SA_1$ is enabled in response to a high level of $\phi_{SE}$ so that the small potential differential is amplified. If the cell MC1 stores "1" level, the amplification is achieved by discharging electric charge at the bit line $\overline{BL1}$. On the contrary, if the cell MC1 stores "0" level, the amplification is achieved by discharging electric charge at the bit line BL1 through the sense amplifier SA1.

Figure 3:
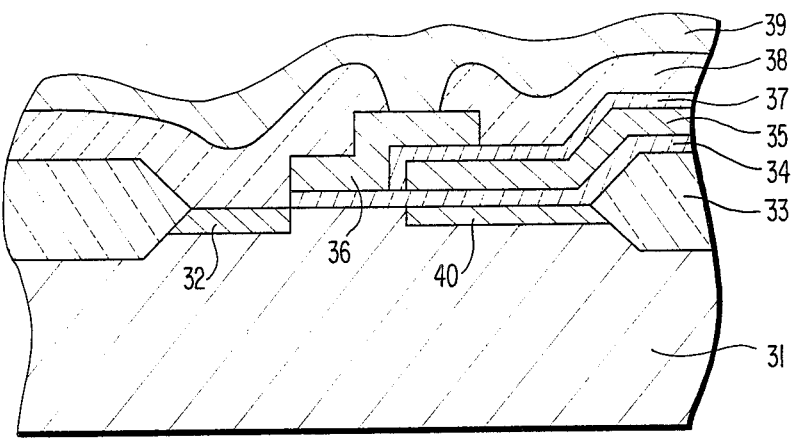
FIG. 3 is a sectional view showing a memory cell according to a prior art.

FIG. 3 illustrates the conventional structure of the memory cell MC1.

On a P-type semiconductor substrate 31, an N-type region 32 as a drain of the transistor $Q_4$, and an N-type region 40 serving as one electrode of the capacitor $C_4$ are provided. A field oxide layer 33 is provided to define cell region. A first polycrystalline layer 35 is formed on the region 40 via a thin insulating layer 34 thereby to form the cell capacitor $C_4$ with the region 40. A second polycrystalline silicon 36 serving as the gate of the cell transistor $Q_4$ is formed and the second polycrystalline silicon 36 overlaps partially with the first polycrystalline silicon 35 and is connected to a word line 39 (WL) of aluminum formed on the substrate 31 via a silicon dioxide layer 38. The region 32 is extending in the direction normal to the word line 39 and forms one of bit lines (BL or $\overline{BL}$). As is clear from FIG. 3, one memory cell employs a multi-layer or stacked-layer structure in which many wiring layers are partially overlapped from each other via inter-layer silicon dioxide and therefore, there are many capacitive couplings between the respective wiring layers. Accordingly, a potential of one of the wiring layers is made a relatively large change, then such potential change is inevitably transmitted to other wirings by the capacitive couplings.

Figure 4:
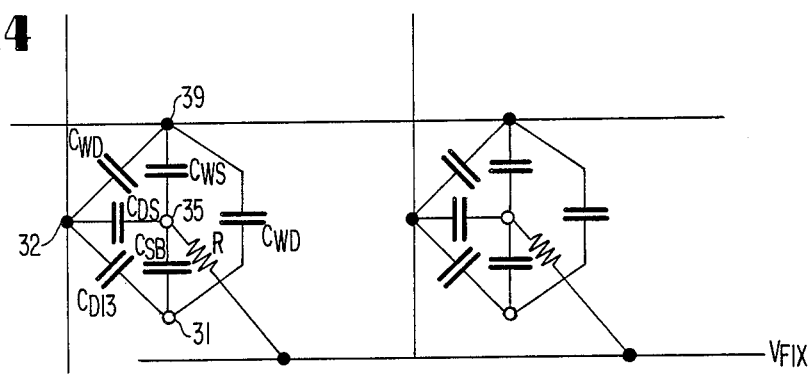
FIG. 4 is an equivalent circuit diagram of the memory cell in view of array-noise.

FIG. 4 shows a simplified model of the capacitive couplings, in which the corresponding portions to FIG. 3 are designated by the same reference numerals.

In FIG. 4, CWD is a capacitance between the word line 39 (WL) and the bit line region 32; CWS a capacitance between the word line 39 and the first polycrystalline silicon 35; CDS a capacitance between the bit line region 32 and the polycrystalline silicon 35, CSB a capacitance between the polycrystalline silicon 35 and the substrate 31; CDB a capacitance between the region 32 and the substrate 31; and CWD a capacitance between the word line 39 and the substrate 31. A resistance R is a wiring resistance of the polycrystalline silicon 35.

When a read operation is performed, half of the bit-lines are discharged by the sense amplifiers. Namely, potentials of half of the bitlines inevitably drop rapidly. The change in potential at the bit line 32 is transmitted to the word line 39 and the silicon wiring 35 via capacitances CWD, CWS and CDS. Thus, potential changes in many wirings act as the array-noise and the wirings are inevitably affected by each other. Thus, the potential change in one bit line is transmitted to other bit lines through the capacitive couplings.

Figure 5:
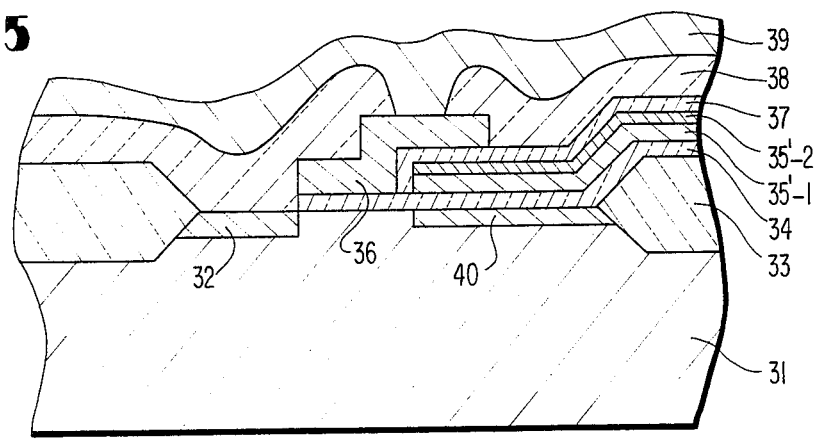
FIG. 5 is a sectional view showing the memory cell according to a first embodiment of the invention.
Figure 6:
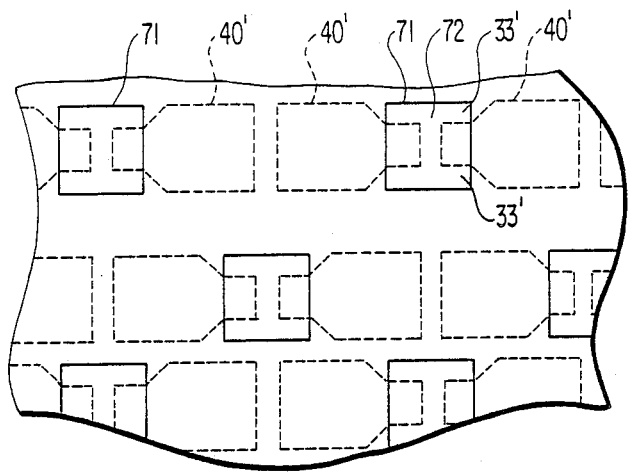
FIG. 6 is a plan view of the memory array according to the first embodiment.

Referring to FIGS. 5 and 6, a first embodiment of the invention will be described. In the drawings, the portions corresponding to those in FIG. 3 are indicated by the same reference numerals.

This embodiment is achieved by forming the capacitor electrode 35 in FIG. 3 with a refractory metal layer $35'$-2 and a polycrystalline silicon $35'$-1. At the surface boundary of the layer $35'$-2 and the polycrystalline silicon $35'$-1, a silicide of the refractory metal is present. As the refractory metal, molybdenum (Mo), tungsten (W), tantalum (Ta), niobium (Nb) and titanium (Ti) can be used. Typical thickness of the refractory metal $35'$-2 is about 3000 Å and the thickness of the silicon layer $35'$-1 is about 3000 Å.

FIG. 6 shows a plan view of the capacitor electrodes $35'$-1,2. As shown in FIG. 6, the electrodes $35'$-1,2 are formed over the respective diffusion regions 40' as the other electrodes of the capacitors as a consecutive single wiring layer with a plurality openings in order to expose the channel regions of the respective memory cell transistors.

According to the present embodiment, in place of high-resistivity polycrystalline silicon 35, the refractory metal - polycrystalline silicon wiring ($35'$-1,$35'$-2) is employed. Therefore, the resistance component R in FIG. 4 can be effectively reduced so that the potential fluctuation at the capacitor electrode (35) can be avoided. Thus, the effect of capacitances CWS, CDS and CSB can be suppressed to reduce the array-noise.

Figure 7:
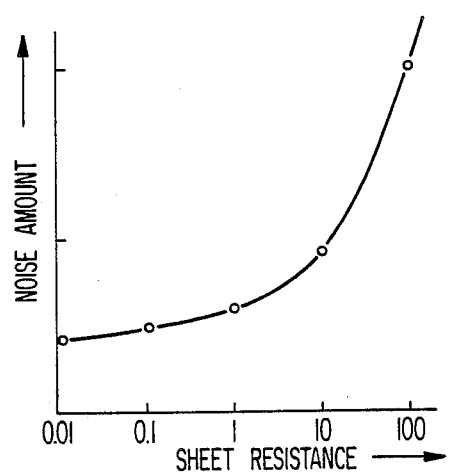
FIG. 7 is a diagram showing the relation between the array-noise and the sheet-resistance of the capacitor electrode wiring layer.

FIG. 7 shows the co-relation between the sheet resistance of the electrode $35'$-1,2 in FIGS. 5 and 6 and the amount of the array-noise. As is clear from FIG. 7, the array-noise is remarkably reduced by employing the electrode $35'$ of the sheet resistance of $10\Omega/\square$ or less. In the above embodiment, $0.2\Omega/\square$ is obtained for Mo and $1\Omega/\square$ for the silicide of Mo. Therefore, the array-noise is significantly reduced.

Figure 8:
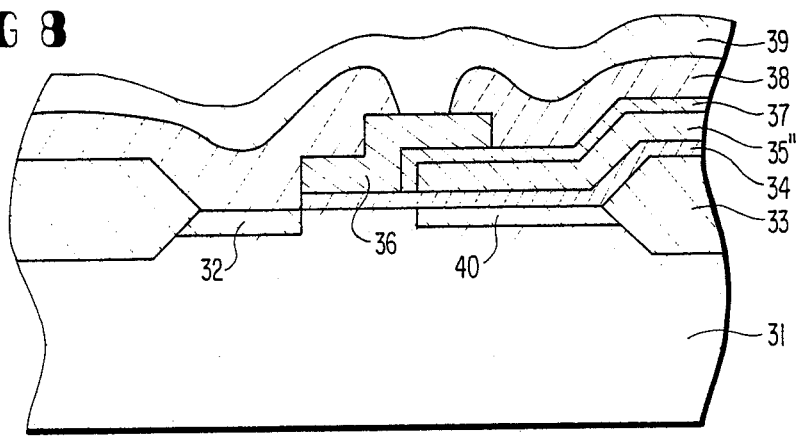
FIG. 8 is a sectional view of the memory cell according to a second embodiment of the invention.

Referring to FIG. 8, a second embodiment of the invention will be described.

This embodiment is realized by replacing the electrode 35 of polycrystalline silicon in FIG. 3 by the electrode $35''$ of a single molybdenum layer. The thickness of the molybdenum layer $35''$ is 4000 Å while the gate polycrystalline silicon is of 6000 Å. As compared to the conventional layer 35 of polycrystalline silicon, the sheet resistance of the molybdenum layer $35''$ is far smaller and therefore, the array-noise can be also effectively suppressed.

Figure 9:
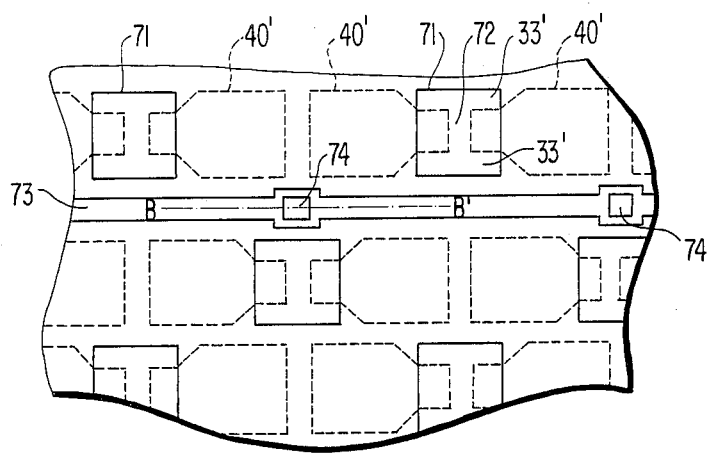
FIG. 9 is a plan view of a memory cell array according to a third embodiment of the present invention.
Figure 10:
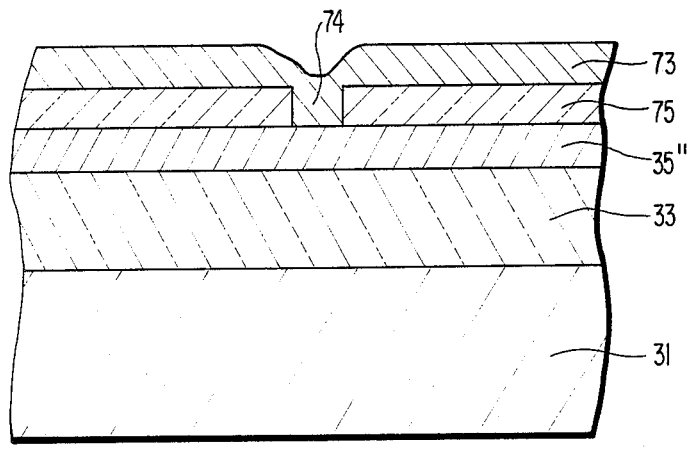
FIG. 10 is a sectional diagram of FIG. 9 along B—B'.
Figure 11:
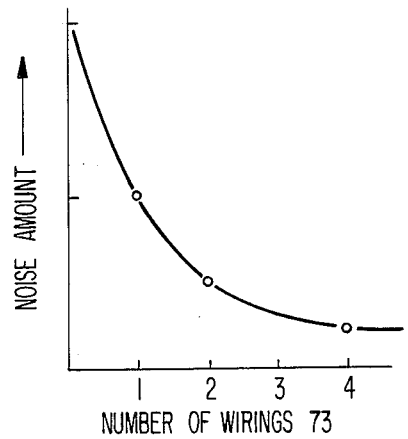
FIG. 11 is a diagram showing the relation between the array-noise and the number of additional wirings employed in the third embodiment.

With reference to FIGS. 9 and 10, a third embodiment of the present invention will be described. In this drawing, the portions correspondinng to those in the previous drawings are indicated by the same reference numerals.

In this figure, the respective capacitor electrodes formed over the respective diffusion regions 40' as other electrodes of the capacitors are made of single consecutive conductive layer $35''$ which may be polycrystalline silicon, refractory metal such as Mo, W, Ti, Ta or silicide of the refractory metal and silicon. Here, on the layer $35''$, a highly-conductive wiring 73 is formed via an insulating layer 75 such as silicon dioxide. The highly-conductive wiring is formed in a strip pattern and contacted with the layer $35''$ at a plurality of contact points 74. The wiring 73 shortcircuits many portions of the layer $35''$ thereby to reduce effective resistance of the layer 35". The wiring 73 itself is preferably connected to the potential source $V_{Fix}$. As the material of the wiring 73, aluminum is advantageously utilized.

FIG. 10 shows the relation between the amount of the array-noise and the number of the wiring 73 over the whole memory cell array. It would be clearly understood that the larger the number of the wirings 73 is, the less the array noise is. In particular, it is clear from FIG. 10 that two or more wirings 73 reduce the array noise effectively.

As described above, the present invention provides dynamic memory devices in which array-noise is suppressed with ease. Although the present invention has been described by way of the embodiments, the present invention is not limited to those embodiments but applicable to other memory devices.

I claim:

1. A semiconductor memory device of the type having a plurality of word lines, a plurality of bit lines and a plurality of memory cells, each of said memory cells including a capacitor having a first electrode, supplied with a predetermined potential, and a second electrode; and a field effect transistor having a source-drain path, coupled between said second electrode of said capacitor and one of said bit lines, and a gate electrode coupled to one of said word lines; wherein said first electrode of said capacitor includes a conductive layer of at least one of refractory metal and silicide of said refractory metal, and comprising an auxiliary wiring layer of a highly-conductive metal formed over said conductive layer through an insulating layer, said auxiliary wiring layer being contacted with a plurality of different portions of said conductive layer.

2. The memory device according to claim 1, wherein the gate electrode of said transistor is formed of polycrystalline silicon.

3. The memory device according to claim 1, wherein said first electrode of said capacitor is made of a single consecutive pattern over a whole memory cell array.

4. The memory device according to claim 1, wherein each of said bit lines includes a diffusion region formed in a semiconductor substrate.

5. The memory device according to claim 1, wherein said refractory metal is selected from the group consisting of molybdenum, tungsten, tantalum, niobium and titanium.

6. The memory device according to claim 1, wherein said gate electrode overlaps partially with said second electrode via an insulating layer.

7. A semiconductor memory device comprising: a semiconductor substrate; a plurality of word lines extending in a first direction; a plurality of bit lines extending in a second direction perpendicular to said first direction; a plurality of memory cells formed on said substrate; each of said memory cells including: a storage capacitor having a first electrode coupled to a predetermined potential source, a second electrode and a switch transistor having a channel, for operatively interconnecting said second electrode of said storage capacitor and one of said bit lines, and a gate electrode electrically connected to one of said word lines; the first electrode of the plurality of storage capacitors being made of a polycrystalline silicon layer; an insulating film covering said polycrystalline silicon layer and having a plurality of openings spaced apart from each other; and a plurality of highly-conductive strip layers extending in said first direction and formed on said insulating film and contacted with said polycrystalline silicon layer through said openings at a plurality of different portions of said polycrystalline silicon layer.

8. The memory device according to claim 7, wherein the gate electrodes of the plurality of transistors are formed of polycrystalline silicon.

9. The memory device according to claim 7, wherein each of said bit lines includes a diffusion region formed in said semiconductor substrate.

10. The memory device according to claim 7, wherein said memory cells are arranged in a plurality of rows, and said highly-conductive strip layers are disposed between rows of the memory cells.

11. The memory device according to claim 7, wherein said highly-conductive strip layers are directly connected to said predetermined potential source.

* * * * *